(12) United States Patent
Cai

(10) Patent No.: US 11,342,324 B2
(45) Date of Patent: May 24, 2022

(54) LOW-LEAKAGE STATIC ELECTRICITY RELEASING CIRCUIT, DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zhenfei Cai, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 217 days.

(21) Appl. No.: 16/957,786

(22) PCT Filed: Jun. 17, 2020

(86) PCT No.: PCT/CN2020/096582
§ 371 (c)(1),
(2) Date: Jun. 25, 2020

(87) PCT Pub. No.: WO2021/232524
PCT Pub. Date: Nov. 25, 2021

(65) Prior Publication Data
US 2021/0358906 A1 Nov. 18, 2021

(30) Foreign Application Priority Data
May 18, 2020 (CN) .......................... 202010421538.5

(51) Int. Cl.
*H01L 27/02* (2006.01)
*G09G 3/00* (2006.01)
*H02H 9/04* (2006.01)

(52) U.S. Cl.
CPC ......... *H01L 27/0292* (2013.01); *G09G 3/035* (2020.08); *H01L 27/0281* (2013.01);
(Continued)

(58) Field of Classification Search
CPC ............. H01L 27/0292; H01L 27/0281; H01L 27/0296; G09G 3/035; G09G 2320/0233; G09G 2330/04; H02H 9/045
(Continued)

(56) References Cited

U.S. PATENT DOCUMENTS 9,515,064 B2 * 12/2016 Sokabe ............... H01L 27/0266
9,768,158 B2    9/2017 Sokabe et al.
(Continued)

FOREIGN PATENT DOCUMENTS

CN    103944154 A    7/2014
CN    104113053 A    10/2014
(Continued)

*Primary Examiner* — Yemane Mehari
(74) *Attorney, Agent, or Firm* — Mark M. Friedman

(57) ABSTRACT

The present application provides a low-leakage static electricity releasing circuit, a display panel and a display device. T1, T2 and T3 that are connected in series are taken as a first group. T4, T5 and T6 that are connected in series are taken as a second group. The first group and the second group serve as releasing paths for static electricity with negative voltages and static electricity with positive voltages, respectively. When one of the groups releases the static electricity, the other group has small current leakage. This reduces the affection of a static electricity releasing circuit on the voltage of a signal line due to the current leakage, and is applicable to static electricity releasing for foldable areas of a flexible, foldable display screen.

18 Claims, 3 Drawing Sheets

(52) U.S. Cl.
CPC ......... *H01L 27/0296* (2013.01); *H02H 9/045* (2013.01); *G09G 2320/0233* (2013.01); *G09G 2330/04* (2013.01)

(58) Field of Classification Search
USPC ........................................................ 361/91.1
See application file for complete search history.

(56) References Cited

U.S. PATENT DOCUMENTS

2005/0285984 A1* 12/2005 Tsai .................. G02F 1/136204
349/40
2016/0123817 A1 5/2016 Bennett et al.

FOREIGN PATENT DOCUMENTS

| | | |
|---|---|---|
| CN | 104280955 | 1/2015 |
| CN | 106611762 | 5/2017 |
| CN | 108269801 A | 7/2018 |
| CN | 110049609 | 7/2019 |

* cited by examiner

LOW-LEAKAGE STATIC ELECTRICITY RELEASING CIRCUIT, DISPLAY PANEL AND DISPLAY DEVICE

FIELD OF THE DISCLOSURE

The present application relates to display technologies, and more particularly to a low-leakage static electricity releasing circuit, a display panel and a display device.

DESCRIPTION OF RELATED ARTS

At present, development of flexible, foldable display panels has become popular. During the development of flexible, foldable display panels, there is a vertical folding process or a horizontal folding process. The folding will change electric properties of thin-film transistors in a foldable area. Therefore, a corresponding static electricity releasing circuit in the foldable area may cause current leakage due to changes of the electric properties of the thin-film transistors in the foldable area. The current leakage causes an input voltage of a signal terminal connected to the static electricity releasing circuit to be inaccurate, thereby resulting in uneven image display.

FIG. 1 is a circuit diagram illustrating a static electricity releasing circuit in an existing skill. Referring to FIG. 1, the static electricity releasing circuit includes four P-type thin-film transistors T10, T20, T30 and T40. T10 and T20 are connected in series to construct a first group. The gate and source of T10 are shorted. The drain of T10 is fed with a constant low voltage level VGL. The gate and source of T20 are connected to a signal line S. The drain of T20 is connected to the source of T10. T30 and T40 are connected in series to construct a second group. The gate and drain of T30 are fed with a constant high voltage level VGH. The source of T30 is connected to the drain of T40. The gate and drain of T40 are shorted. The source of T40 is connected to the signal line S.

When static electricity with negative voltages flows into the circuit from the signal line S, T10 and T20 are turned on and the static electricity with negative voltages is fed with the constant low voltage level via T10 and T20. However, at this time, if the current leakage is generated at T30 and T40 due to changes of electric properties caused by the folding, it will make the voltage of the signal line S be inaccurate. When static electricity with positive voltages flows into the circuit from the signal line S, T30 and T40 are turned on and the static electricity with positive voltages is fed with the constant high voltage level via T30 and T40. However, at this time, if the current leakage is generated at T10 and T20 due to changes of electric properties caused by the folding, it will also make the voltage of the signal line S be inaccurate.

Technical Problems

The present application provides a low-leakage static electricity releasing circuit, a display panel and a display device, for solving the problem of uneven image display (Mura) caused by a static electricity releasing circuit of a foldable area of an existing flexible, foldable display screen since current leakage will be generated due to changes of electric properties of thin-film transistors in the foldable area and the current leakage will lead to inaccurate voltage of a signal line.

Technical Solutions

In a first aspect, the present application provides a low-leakage static electricity releasing circuit, which includes a signal line and an electrostatic protection device electrically connected to the signal line; the electrostatic protection device including a first thin-film transistor, a second thin-film transistor, a third thin-film transistor, a fourth thin-film transistor, a fifth thin-film transistor, a sixth thin-film transistor, a first capacitor and a second capacitor; a gate of the first thin-film transistor electrically connected to a first end of the first capacitor, a drain of the first thin-film transistor electrically connected to a first node, a source of the first thin-film transistor fed with a first voltage level; the gate and the drain of the second thin-film transistor electrically connected to a second node, the source of the second thin-film transistor electrically connected to the first node; the gate and the drain of the third thin-film transistor electrically connected to the signal line, the source of the third thin-film transistor electrically connected to the second node; the gate and the drain of the fourth thin-film transistor fed with a second voltage level, the source of the fourth thin-film transistor electrically connected to a third node; the gate and the drain of the fifth thin-film transistor electrically connected to the third node, the source of the fifth thin-film transistor electrically connected to a fourth node; the gate of the sixth thin-film transistor electrically connected to a first end of the second capacitor, the source of the sixth thin-film transistor electrically connected to the fourth node, the drain of the sixth thin-film transistor electrically connected to the signal line; a second end of the first capacitor electrically connected to the signal line, a second end of the second capacitor fed with the second voltage level.

In some embodiments, all of the first thin-film transistor, the second thin-film transistor, the third thin-film transistor, the fourth thin-film transistor, the fifth thin-film transistor and the sixth thin-film transistor are P-type thin-film transistors, the first voltage level is a constant low voltage level, and the second voltage level is a constant high voltage level.

In some embodiments, all of the first thin-film transistor, the second thin-film transistor, the third thin-film transistor, the fourth thin-film transistor, the fifth thin-film transistor and the sixth thin-film transistor are N-type thin-film transistors, the first voltage level is a constant high voltage level, and the second voltage level is a constant low voltage level.

In some embodiments, when static electricity with negative voltages is inputted from the signal line to the electrostatic protection device, the first thin-film transistor, the second thin-film transistor and the third thin-film transistor are turned on, and the sixth thin-film transistor is turned off; when static electricity with positive voltages is inputted from the signal line to the electrostatic protection device, the fourth thin-film transistor, the fifth thin-film transistor and the sixth thin-film transistor are turned on, and the first thin-film transistor is turned off.

In some embodiments, when static electricity with negative voltages is inputted from the signal line to the electrostatic protection device, the fourth thin-film transistor, the fifth thin-film transistor and the sixth thin-film transistor are turned on, and the first thin-film transistor is turned off; when static electricity with positive voltages is inputted from the signal line to the electrostatic protection device, the first thin-film transistor, the second thin-film transistor and the third thin-film transistor are turned on, and the sixth thin-film transistor is turned off.

In some embodiments, the static electricity with negative voltages and the static electricity with positive voltages are thousand volts.

In a second aspect, the present application further provides a display panel, including a low-leakage static electricity releasing circuit, which includes a signal line and an electrostatic protection device electrically connected to the signal line;

the electrostatic protection device including a first thin-film transistor, a second thin-film transistor, a third thin-film transistor, a fourth thin-film transistor, a fifth thin-film transistor, a sixth thin-film transistor, a first capacitor and a second capacitor;

a gate of the first thin-film transistor electrically connected to a first end of the first capacitor, a drain of the first thin-film transistor electrically connected to a first node, a source of the first thin-film transistor fed with a first voltage level;

the gate and the drain of the second thin-film transistor electrically connected to a second node, the source of the second thin-film transistor electrically connected to the first node;

the gate and the drain of the third thin-film transistor electrically connected to the signal line, the source of the third thin-film transistor electrically connected to the second node;

the gate and the drain of the fourth thin-film transistor fed with a second voltage level, the source of the fourth thin-film transistor electrically connected to a third node;

the gate and the drain of the fifth thin-film transistor electrically connected to the third node, the source of the fifth thin-film transistor electrically connected to a fourth node;

the gate of the sixth thin-film transistor electrically connected to a first end of the second capacitor, the source of the sixth thin-film transistor electrically connected to the fourth node, the drain of the sixth thin-film transistor electrically connected to the signal line;

a second end of the first capacitor electrically connected to the signal line, a second end of the second capacitor fed with the second voltage level.

In some embodiments, all of the first thin-film transistor, the second thin-film transistor, the third thin-film transistor, the fourth thin-film transistor, the fifth thin-film transistor and the sixth thin-film transistor are P-type thin-film transistors, the first voltage level is a constant low voltage level, and the second voltage level is a constant high voltage level.

In some embodiments, all of the first thin-film transistor, the second thin-film transistor, the third thin-film transistor, the fourth thin-film transistor, the fifth thin-film transistor and the sixth thin-film transistor are N-type thin-film transistors, the first voltage level is a constant high voltage level, and the second voltage level is a constant low voltage level.

In some embodiments, when static electricity with negative voltages is inputted from the signal line to the electrostatic protection device, the first thin-film transistor, the second thin-film transistor and the third thin-film transistor are turned on, and the sixth thin-film transistor is turned off; when static electricity with positive voltages is inputted from the signal line to the electrostatic protection device, the fourth thin-film transistor, the fifth thin-film transistor and the sixth thin-film transistor are turned on, and the first thin-film transistor is turned off.

In some embodiments, when static electricity with negative voltages is inputted from the signal line to the electrostatic protection device, the fourth thin-film transistor, the fifth thin-film transistor and the sixth thin-film transistor are turned on, and the first thin-film transistor is turned off; when static electricity with positive voltages is inputted from the signal line to the electrostatic protection device, the first thin-film transistor, the second thin-film transistor and the third thin-film transistor are turned on, and the sixth thin-film transistor is turned off.

In some embodiments, the static electricity with negative voltages and the static electricity with positive voltages are thousand volts.

In a third aspect, the present application further provides a display device including a display panel, including a low-leakage static electricity releasing circuit, which includes a signal line and an electrostatic protection device electrically connected to the signal line;

the electrostatic protection device including a first thin-film transistor, a second thin-film transistor, a third thin-film transistor, a fourth thin-film transistor, a fifth thin-film transistor, a sixth thin-film transistor, a first capacitor and a second capacitor;

a gate of the first thin-film transistor electrically connected to a first end of the first capacitor, a drain of the first thin-film transistor electrically connected to a first node, a source of the first thin-film transistor fed with a first voltage level;

the gate and the drain of the second thin-film transistor electrically connected to a second node, the source of the second thin-film transistor electrically connected to the first node;

the gate and the drain of the third thin-film transistor electrically connected to the signal line, the source of the third thin-film transistor electrically connected to the second node;

the gate and the drain of the fourth thin-film transistor fed with a second voltage level, the source of the fourth thin-film transistor electrically connected to a third node;

the gate and the drain of the fifth thin-film transistor electrically connected to the third node, the source of the fifth thin-film transistor electrically connected to a fourth node;

the gate of the sixth thin-film transistor electrically connected to a first end of the second capacitor, the source of the sixth thin-film transistor electrically connected to the fourth node, the drain of the sixth thin-film transistor electrically connected to the signal line;

a second end of the first capacitor electrically connected to the signal line, a second end of the second capacitor fed with the second voltage level.

In some embodiments, all of the first thin-film transistor, the second thin-film transistor, the third thin-film transistor, the fourth thin-film transistor, the fifth thin-film transistor and the sixth thin-film transistor are P-type thin-film transistors, the first voltage level is a constant low voltage level, and the second voltage level is a constant high voltage level.

In some embodiments, all of the first thin-film transistor, the second thin-film transistor, the third thin-film transistor, the fourth thin-film transistor, the fifth thin-film transistor and the sixth thin-film transistor are N-type thin-film transistors, the first voltage level is a constant high voltage level, and the second voltage level is a constant low voltage level.

In some embodiments, when static electricity with negative voltages is inputted from the signal line to the electrostatic protection device, the first thin-film transistor, the second thin-film transistor and the third thin-film transistor are turned on, and the sixth thin-film transistor is turned off; when static electricity with positive voltages is inputted from the signal line to the electrostatic protection device, the fourth thin-film transistor, the fifth thin-film transistor and the sixth thin-film transistor are turned on, and the first thin-film transistor is turned off.

In some embodiments, when static electricity with negative voltages is inputted from the signal line to the electrostatic protection device, the fourth thin-film transistor, the fifth thin-film transistor and the sixth thin-film transistor are turned on, and the first thin-film transistor is turned off; when static electricity with positive voltages is inputted from the signal line to the electrostatic protection device, the first thin-film transistor, the second thin-film transistor and the third thin-film transistor are turned on, and the sixth thin-film transistor is turned off.

In some embodiments, the static electricity with negative voltages and the static electricity with positive voltages are thousand volts.

BENEFICIAL EFFECTS

In the low-leakage static electricity releasing circuit, the display panel and the display device provided in the embodiment of the present application, the low-leakage static electricity releasing circuit adopts a 6T2C structure. The first thin-film transistor, the second thin-film transistor and the third thin-film transistor that are sequentially connected in series are taken as a first group. The fourth thin-film transistor, the fifth thin-film transistor and the sixth thin-film transistor that are sequentially connected in series are taken as a second group. One end of the first group and one end of the second group are connected to the signal line. The other end of the first group and the other end of the second group are fed with the first voltage level and the second voltage level, respectively. The first voltage level and the second voltage level are referred to the constant high voltage level or the constant low voltage level. The first group and the second group serve as releasing paths for static electricity with negative voltages and static electricity with positive voltages, respectively. When one of the groups is releasing the static electricity with negative voltages or the static electricity with positive voltages, the other group has small current leakage. Therefore, compared to the static electricity releasing circuit in the existing skill, this reduces the affection of a static electricity releasing circuit on the voltage of the signal line due to the current leakage, and is applicable to a static electricity releasing circuit corresponding to foldable areas of a flexible, foldable display screen.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

In all of the embodiments of the present application, in order to distinguish two electrodes of a transistor except for a gate, one of the two electrodes is called a source and the other of the two electrodes is called a drain. Since the source and the drain of the transistor are symmetrical in a sense, the source and the drain are interchangeable. A middle end of the transistor is a gate, a signal input end of the transistor is a source and a signal output end of the transistor is the drain, as specified according to a shape or pattern shown in the appending figures. In addition, the transistors utilized in all of the embodiments of the present application may include P-type transistors and/or N-type transistors. The P-type transistor is turned on when the gate is at low voltage level and is turned off when the gate is at high voltage level; the N-type transistor is turned on when the gate is at high voltage level and is turned off when the gate is at low voltage level.

Figure 1:
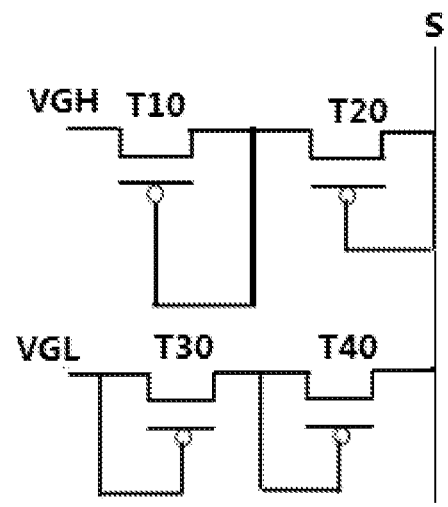
FIG. 1 is a circuit diagram illustrating a static electricity releasing circuit in an existing skill.
Figure 2:
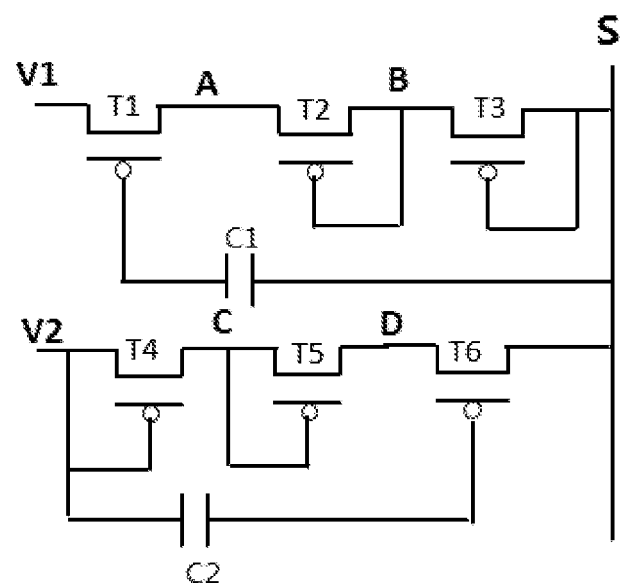
FIG. 2 is a circuit diagram illustrating a low-leakage static electricity releasing circuit provided in an embodiment of the present application.

FIG. 2 is a circuit diagram illustrating a low-leakage static electricity releasing circuit provided in an embodiment of the present application. Referring to FIG. 2, an embodiment of the present application provides a low-leakage static electricity releasing circuit, which includes a signal line S and an electrostatic protection device electrically connected to the signal line S.

The electrostatic protection device includes a first thin-film transistor T1, a second thin-film transistor T2, a third thin-film transistor T3, a fourth thin-film transistor T4, a fifth thin-film transistor T5, a sixth thin-film transistor T6, a first capacitor C1 and a second capacitor C2.

The gate of the first thin-film transistor T1 is electrically connected to a first end of the first capacitor C1, the drain of the first thin-film transistor T1 is electrically connected to a first node, and the source of the first thin-film transistor T1 is fed with a first voltage level V1.

The gate and the drain of the second thin-film transistor T2 are electrically connected to a second node, and the source of the second thin-film transistor T2 is electrically connected to the first node.

The gate and the drain of the third thin-film transistor T3 are electrically connected to the signal line S, and the source of the third thin-film transistor T3 is electrically connected to the second node;

The gate and the drain of the fourth thin-film transistor T4 are fed with a second voltage level V2, and the source of the fourth thin-film transistor T4 is electrically connected to a third node.

The gate and the drain of the fifth thin-film transistor T5 are electrically connected to the third node, and the source of the fifth thin-film transistor T5 is electrically connected to a fourth node.

The gate of the sixth thin-film transistor T6 is electrically connected to a first end of the second capacitor C2, the source of the sixth thin-film transistor T6 is electrically connected to the fourth node, and the drain of the sixth thin-film transistor T6 is electrically connected to the signal line S.

A second end of the first capacitor C1 is electrically connected to the signal line S, and a second end of the second capacitor C2 is fed with the second voltage level V2.

It should be noted that the first voltage level V1 and the second voltage level V2 are two different voltage levels, and the first voltage level V1 and the second voltage level V2 are referred to a constant high voltage level VGH or a constant low voltage level VGL.

It can be understood that the signal line S can be at least one of a data line and a scan line.

Specifically, the low-leakage static electricity releasing circuit provided in the embodiment of the present application adopts a 6T2C structure. The first thin-film transistor T1, the second thin-film transistor T2 and the third thin-film transistor T3 that are sequentially connected in series are taken as a first group. The fourth thin-film transistor T4, the fifth thin-film transistor T5 and the sixth thin-film transistor T6 that are sequentially connected in series are taken as a second group. One end of the first group and one end of the second group are connected to the signal line S. The other end of the first group and the other end of the second group are fed with the first voltage level V1 and the second voltage level V2, respectively. The first voltage level V1 and the second voltage level V2 are referred to the constant high voltage level VGH or the constant low voltage level VGL. The first group and the second group serve as releasing paths for static electricity with negative voltages and static electricity with positive voltages, respectively. When one of the groups is releasing the static electricity with negative voltages or the static electricity with positive voltages, the other group has small current leakage. Therefore, compared to the static electricity releasing circuit in the existing skill, this reduces the affection of a static electricity releasing circuit on the voltage of the signal line S due to the current leakage, and is applicable to a static electricity releasing circuit corresponding to foldable areas of a flexible, foldable display screen.

Figure 3:
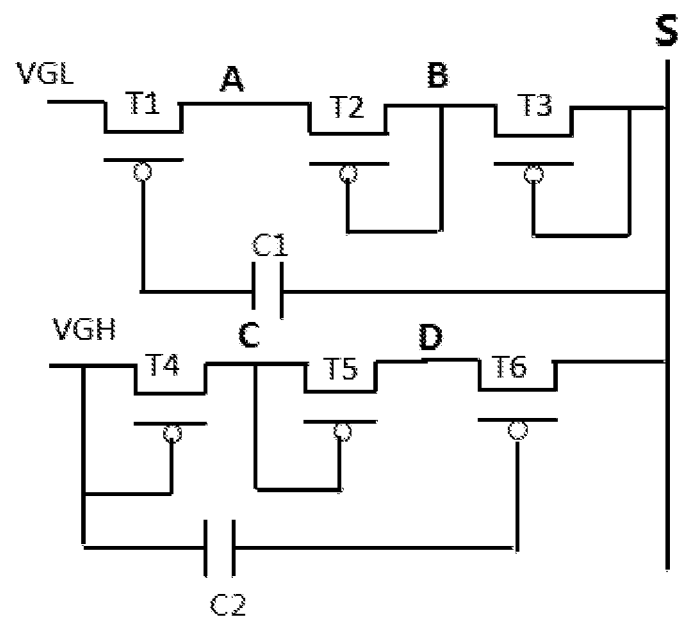
FIG. 3 is a first circuit diagram illustrating a low-leakage static electricity releasing circuit provided in an embodiment of the present application.

FIG. 3 is a first circuit diagram illustrating a low-leakage static electricity releasing circuit provided in an embodiment of the present application. Referring to FIG. 3, all of the first thin-film transistor T1, the second thin-film transistor T2, the third thin-film transistor T3, the fourth thin-film transistor T4, the fifth thin-film transistor T5 and the sixth thin-film transistor T6 of the low-leakage static electricity releasing circuit are P-type thin-film transistors, the first voltage level V1 is a constant low voltage level VGL, and the second voltage level V2 is a constant high voltage level VGH.

When static electricity with negative voltages is inputted from the signal line S to the electrostatic protection device, the first thin-film transistor T1, the second thin-film transistor T2 and the third thin-film transistor T3 are turned on, and the sixth thin-film transistor T6 is turned off; when static electricity with positive voltages is inputted from the signal line S to the electrostatic protection device, the fourth thin-film transistor T4, the fifth thin-film transistor T5 and the sixth thin-film transistor T6 are turned on, and the first thin-film transistor T1 is turned off.

Specifically, when the static electricity with negative voltages is inputted from the signal line S to the electrostatic protection device, the first thin-film transistor T1 is turned on by the actions of the constant low voltage level VGL, the static electricity with negative voltages and the coupling of the first capacitor C1 such that the potential of the first node is at the constant low voltage level VGL. The third thin-film transistor T3 is turned on by the actions of the static electricity with negative voltages such that the potential of the second node is at the potential of the static electricity with negative voltages. The second thin-film transistor T2 is turned on by the actions of the constant low voltage level VGL and the static electricity with negative voltages, thereby making the static electricity with negative voltages be fed with the constant low voltage level VGL via the third thin-film transistor T3, the second thin-film transistor T2 and the first thin-film transistor T1. Meanwhile, the sixth thin-film transistor T6 is completely turned off by the actions of the static electricity with negative voltages, the constant high voltage level VGH and the coupling of the second capacitor C2. It has very small current leakage. Therefore, even when the current leakage is generated due to changes of electric properties of the fourth thin-film transistor T4 and the fifth thin-film transistor T5 caused by a folding operation, it will not affect the voltage of the signal line S.

Further, when the static electricity with positive voltages is inputted from the signal line S to the electrostatic protection device, the sixth thin-film transistor T6 is turned on by the actions of the static electricity with positive voltages and the coupling of the second capacitor C2 such that the potential of the fourth node is at the potential of the static electricity with positive voltages. The fifth thin-film transistor T5 is turned on by the actions of the static electricity with positive voltages such that the potential of the third node is at the potential of the static electricity with positive voltages. The fourth thin-film transistor T4 is turned on by the actions of the static electricity with positive voltages and the constant high voltage level VGH, thereby making the static electricity with positive voltages be fed with the constant high voltage level VGH via the sixth thin-film transistor T6, the fifth thin-film transistor T5 and the fourth thin-film transistor T4. Meanwhile, the first thin-film transistor T1 is completely turned off by the actions of the static electricity with positive voltages, the constant low voltage level VGL and the coupling of the first capacitor C1. It has very small current leakage. Therefore, even when the current leakage is generated due to changes of electric properties of the second thin-film transistor T2 and the third thin-film transistor T3 caused by a folding operation, it will not affect the voltage of the signal line S.

Figure 4:
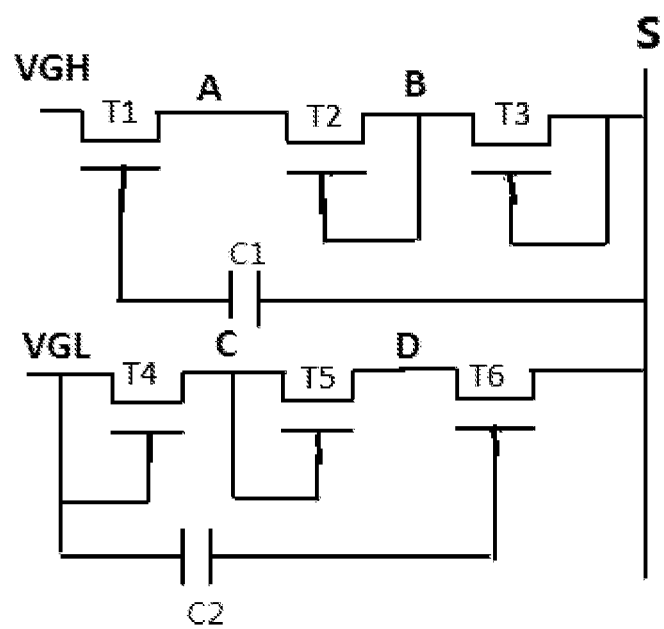
FIG. 4 is a second circuit diagram illustrating a low-leakage static electricity releasing circuit provided in an embodiment of the present application.

FIG. 4 is a second circuit diagram illustrating a low-leakage static electricity releasing circuit provided in an embodiment of the present application. Referring to FIG. 4, all of the first thin-film transistor T1, the second thin-film transistor T2, the third thin-film transistor T3, the fourth thin-film transistor T4, the fifth thin-film transistor T5 and the sixth thin-film transistor T6 of the low-leakage static electricity releasing circuit are N-type thin-film transistors, the first voltage level V1 is a constant high voltage level VGH, and the second voltage level V2 is a constant low voltage level VGL.

When static electricity with negative voltages is inputted from the signal line S to the electrostatic protection device, the fourth thin-film transistor T4, the fifth thin-film transistor T5 and the sixth thin-film transistor T6 are turned on, and the first thin-film transistor T1 is turned off; when static electricity with positive voltages is inputted from the signal line S to the electrostatic protection device, the first thin-film transistor T1, the second thin-film transistor T2 and the third thin-film transistor T3 are turned on, and the sixth thin-film transistor T6 is turned off.

Specifically, when the static electricity with negative voltages is inputted from the signal line S to the electrostatic protection device, the sixth thin-film transistor T6 is turned on by the actions of the static electricity with negative voltages and the coupling of the second capacitor C2 such that the potential of the fourth node is at the potential of the static electricity with negative voltages. The fifth thin-film transistor T5 is turned on by the actions of the static electricity with negative voltages such that the potential of the third node is at the potential of the static electricity with negative voltages. The fourth thin-film transistor T4 is turned on by the actions of the static electricity with negative voltages and the constant low voltage level VGL, thereby making the static electricity with negative voltages be fed with the constant low voltage level VGL via the sixth thin-film transistor T6, the fifth thin-film transistor T5 and the fourth thin-film transistor T4. Meanwhile, the first thin-film transistor T1 is completely turned off by the actions of the static electricity with negative voltages, the constant high voltage level VGH and the coupling of the first capacitor C1. It has very small current leakage. Therefore, even when the current leakage is generated due to changes of electric properties of the second thin-film transistor T2 and the third thin-film transistor T3 caused by a folding operation, it will not affect the voltage of the signal line S.

Further, when the static electricity with positive voltages is inputted from the signal line S to the electrostatic protection device, the first thin-film transistor T1 is turned on by the actions of the constant high voltage level VGH, the static electricity with positive voltages and the coupling of the first capacitor C1 such that the potential of the first node is at the constant high voltage level VGH. The third thin-film transistor T3 is turned on by the actions of the static electricity with positive voltages such that the potential of the second node is at the potential of the static electricity with positive voltages. The second thin-film transistor T2 is turned on by the actions of the constant high voltage level VGH and the static electricity with positive voltages, thereby making the static electricity with positive voltages be fed with the constant high voltage level VGH via the third thin-film transistor T3, the second thin-film transistor T2 and the first thin-film transistor T1. Meanwhile, the sixth thin-film transistor T6 is completely turned off by the actions of the static electricity with positive voltages, the constant low voltage level VGL and the coupling of the second capacitor C2. It has very small current leakage. Therefore, even when the current leakage is generated due to changes of electric properties of the fourth thin-film transistor T4 and the fifth thin-film transistor T5 caused by a folding operation, it will not affect the voltage of the signal line S.

It should be noted that the static electricity with negative voltages and the static electricity with positive voltages are thousand volts, that is, the values of the static electricity with negative voltages and the static electricity with positive voltages are much higher than the constant low voltage level VGL and the constant high voltage level VGH.

Figure 5:
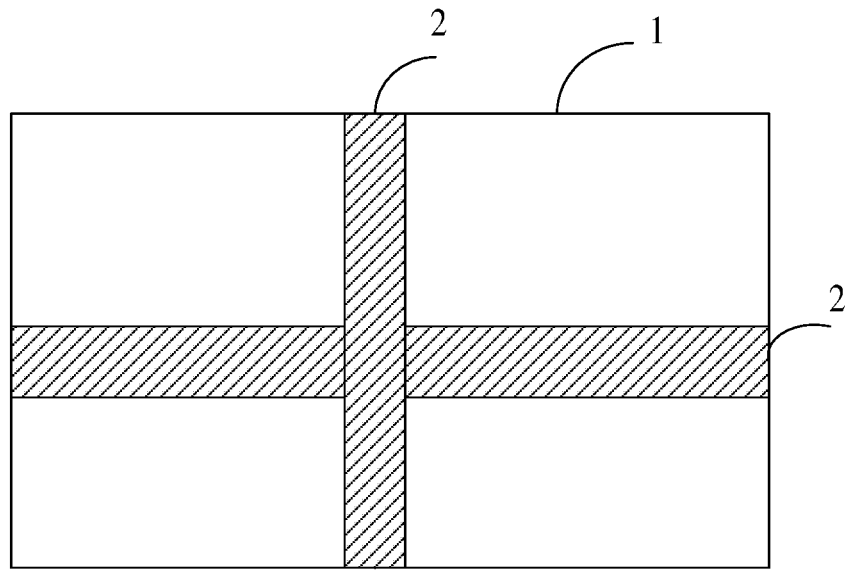
FIG. 5 is a structural schematic diagram illustrating a display panel provided in an embodiment of the present application.

FIG. 5 is a structural schematic diagram illustrating a display panel provided in an embodiment of the present application. Referring to FIG. 5, an embodiment of the present application further provides a display panel 1, which includes the afore-described low-leakage static electricity releasing circuit in a foldable area 2. In the foldable area 2, the display panel 1 has a same structure and a same beneficial effect as the low-leakage static electricity releasing circuit provided in above embodiments, which are not repeated herein for that the structure and beneficial effect of the low-leakage static electricity releasing circuit have been described in detail in above embodiments.

Figure 6:
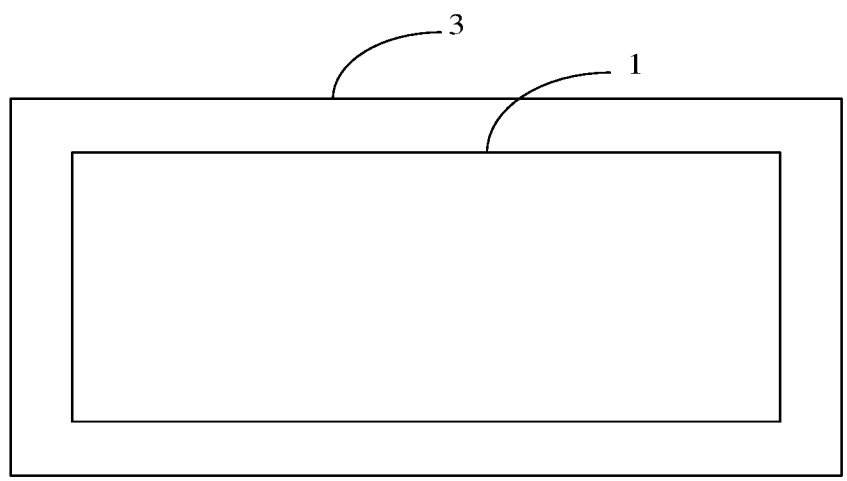
FIG. 6 is a structural schematic diagram illustrating a display device provided in an embodiment of the present application.

FIG. 6 is a structural schematic diagram illustrating a display device provided in an embodiment of the present application. As shown in FIG. 6, an embodiment of the present application provides a display device 3, which includes the afore-described display panel 1. The display device 3 has a same structure and a same beneficial effect as the display panel 1, which are not repeated herein.

It should be understood that those of ordinary skill in the art may make equivalent modifications or variations according to the technical schemes and invention concepts of the present application, but all such modifications and variations should be within the appended claims of the present application.

The invention claimed is:

1. A low-leakage static electricity releasing circuit, comprising: a signal line and an electrostatic protection device electrically connected to the signal line;
   the electrostatic protection device comprising a first thin-film transistor, a second thin-film transistor, a third thin-film transistor, a fourth thin-film transistor, a fifth thin-film transistor, a sixth thin-film transistor, a first capacitor and a second capacitor;
   a gate of the first thin-film transistor electrically connected to a first end of the first capacitor, a drain of the first thin-film transistor electrically connected to a first node, a source of the first thin-film transistor fed with a first voltage level;
   the gate and the drain of the second thin-film transistor electrically connected to a second node, the source of the second thin-film transistor electrically connected to the first node;
   the gate and the drain of the third thin-film transistor electrically connected to the signal line, the source of the third thin-film transistor electrically connected to the second node;
   the gate and the drain of the fourth thin-film transistor fed with a second voltage level, the source of the fourth thin-film transistor electrically connected to a third node;
   the gate and the drain of the fifth thin-film transistor electrically connected to the third node, the source of the fifth thin-film transistor electrically connected to a fourth node;
   the gate of the sixth thin-film transistor electrically connected to a first end of the second capacitor, the source of the sixth thin-film transistor electrically connected to the fourth node, the drain of the sixth thin-film transistor electrically connected to the signal line;
   a second end of the first capacitor electrically connected to the signal line, a second end of the second capacitor fed with the second voltage level.

2. The low-leakage static electricity releasing circuit according to claim 1, wherein all of the first thin-film transistor, the second thin-film transistor, the third thin-film transistor, the fourth thin-film transistor, the fifth thin-film transistor and the sixth thin-film transistor are P-type thin-film transistors, the first voltage level is a constant low voltage level, and the second voltage level is a constant high voltage level.

3. The low-leakage static electricity releasing circuit according to claim 1, wherein all of the first thin-film transistor, the second thin-film transistor, the third thin-film transistor, the fourth thin-film transistor, the fifth thin-film transistor and the sixth thin-film transistor are N-type thin-film transistors, the first voltage level is a constant high voltage level, and the second voltage level is a constant low voltage level.

4. The low-leakage static electricity releasing circuit according to claim 2, wherein when static electricity with negative voltages is inputted from the signal line to the electrostatic protection device, the first thin-film transistor, the second thin-film transistor and the third thin-film transistor are turned on, and the sixth thin-film transistor is turned off; when static electricity with positive voltages is inputted from the signal line to the electrostatic protection device, the fourth thin-film transistor, the fifth thin-film transistor and the sixth thin-film transistor are turned on, and the first thin-film transistor is turned off.

5. The low-leakage static electricity releasing circuit according to claim 3, wherein when static electricity with negative voltages is inputted from the signal line to the electrostatic protection device, the fourth thin-film transistor, the fifth thin-film transistor and the sixth thin-film transistor are turned on, and the first thin-film transistor is turned off; when static electricity with positive voltages is inputted from the signal line to the electrostatic protection device, the first thin-film transistor, the second thin-film transistor and the third thin-film transistor are turned on, and the sixth thin-film transistor is turned off.

6. The low-leakage static electricity releasing circuit according to claim 4, wherein the static electricity with negative voltages and the static electricity with positive voltages are thousand volts.

7. A display panel, comprising a low-leakage static electricity releasing circuit, which comprises a signal line and an electrostatic protection device electrically connected to the signal line;
the electrostatic protection device comprising a first thin-film transistor, a second thin-film transistor, a third thin-film transistor, a fourth thin-film transistor, a fifth thin-film transistor, a sixth thin-film transistor, a first capacitor and a second capacitor;
a gate of the first thin-film transistor electrically connected to a first end of the first capacitor, a drain of the first thin-film transistor electrically connected to a first node, a source of the first thin-film transistor fed with a first voltage level;
the gate and the drain of the second thin-film transistor electrically connected to a second node, the source of the second thin-film transistor electrically connected to the first node;
the gate and the drain of the third thin-film transistor electrically connected to the signal line, the source of the third thin-film transistor electrically connected to the second node;
the gate and the drain of the fourth thin-film transistor fed with a second voltage level, the source of the fourth thin-film transistor electrically connected to a third node;
the gate and the drain of the fifth thin-film transistor electrically connected to the third node, the source of the fifth thin-film transistor electrically connected to a fourth node;
the gate of the sixth thin-film transistor electrically connected to a first end of the second capacitor, the source of the sixth thin-film transistor electrically connected to the fourth node, the drain of the sixth thin-film transistor electrically connected to the signal line;
a second end of the first capacitor electrically connected to the signal line, a second end of the second capacitor fed with the second voltage level.

8. The display panel according to claim 7, wherein all of the first thin-film transistor, the second thin-film transistor, the third thin-film transistor, the fourth thin-film transistor, the fifth thin-film transistor and the sixth thin-film transistor are P-type thin-film transistors, the first voltage level is a constant low voltage level, and the second voltage level is a constant high voltage level.

9. The display panel according to claim 7, wherein all of the first thin-film transistor, the second thin-film transistor, the third thin-film transistor, the fourth thin-film transistor, the fifth thin-film transistor and the sixth thin-film transistor are N-type thin-film transistors, the first voltage level is a constant high voltage level, and the second voltage level is a constant low voltage level.

10. The display panel according to claim 8, wherein when static electricity with negative voltages is inputted from the signal line to the electrostatic protection device, the first thin-film transistor, the second thin-film transistor and the third thin-film transistor are turned on, and the sixth thin-film transistor is turned off; when static electricity with positive voltages is inputted from the signal line to the electrostatic protection device, the fourth thin-film transistor, the fifth thin-film transistor and the sixth thin-film transistor are turned on, and the first thin-film transistor is turned off.

11. The display panel according to claim 9, wherein when static electricity with negative voltages is inputted from the signal line to the electrostatic protection device, the fourth thin-film transistor, the fifth thin-film transistor and the sixth thin-film transistor are turned on, and the first thin-film transistor is turned off; when static electricity with positive voltages is inputted from the signal line to the electrostatic protection device, the first thin-film transistor, the second thin-film transistor and the third thin-film transistor are turned on, and the sixth thin-film transistor is turned off.

12. The display panel according to claim 10, wherein the static electricity with negative voltages and the static electricity with positive voltages are thousand volts.

13. A display device, comprising a display panel comprising a low-leakage static electricity releasing circuit, which comprises a signal line and an electrostatic protection device electrically connected to the signal line;
the electrostatic protection device comprising a first thin-film transistor, a second thin-film transistor, a third thin-film transistor, a fourth thin-film transistor, a fifth thin-film transistor, a sixth thin-film transistor, a first capacitor and a second capacitor;
a gate of the first thin-film transistor electrically connected to a first end of the first capacitor, a drain of the first thin-film transistor electrically connected to a first node, a source of the first thin-film transistor fed with a first voltage level;
the gate and the drain of the second thin-film transistor electrically connected to a second node, the source of the second thin-film transistor electrically connected to the first node;
the gate and the drain of the third thin-film transistor electrically connected to the signal line, the source of the third thin-film transistor electrically connected to the second node;
the gate and the drain of the fourth thin-film transistor fed with a second voltage level, the source of the fourth thin-film transistor electrically connected to a third node;
the gate and the drain of the fifth thin-film transistor electrically connected to the third node, the source of the fifth thin-film transistor electrically connected to a fourth node;
the gate of the sixth thin-film transistor electrically connected to a first end of the second capacitor, the source of the sixth thin-film transistor electrically connected to the fourth node, the drain of the sixth thin-film transistor electrically connected to the signal line;
a second end of the first capacitor electrically connected to the signal line, a second end of the second capacitor fed with the second voltage level.

14. The display device according to claim 13, wherein all of the first thin-film transistor, the second thin-film transistor, the third thin-film transistor, the fourth thin-film transistor, the fifth thin-film transistor and the sixth thin-film transistor are P-type thin-film transistors, the first voltage level is a constant low voltage level, and the second voltage level is a constant high voltage level.

15. The display device according to claim 13, wherein all of the first thin-film transistor, the second thin-film transistor, the third thin-film transistor, the fourth thin-film transistor, the fifth thin-film transistor and the sixth thin-film transistor are N-type thin-film transistors, the first voltage level is a constant high voltage level, and the second voltage level is a constant low voltage level.

16. The display device according to claim 14, wherein when static electricity with negative voltages is inputted from the signal line to the electrostatic protection device, the first thin-film transistor, the second thin-film transistor and the third thin-film transistor are turned on, and the sixth thin-film transistor is turned off; when static electricity with positive voltages is inputted from the signal line to the electrostatic protection device, the fourth thin-film transistor, the fifth thin-film transistor and the sixth thin-film transistor are turned on, and the first thin-film transistor is turned off.

17. The display device according to claim 15, wherein when static electricity with negative voltages is inputted from the signal line to the electrostatic protection device, the fourth thin-film transistor, the fifth thin-film transistor and the sixth thin-film transistor are turned on, and the first thin-film transistor is turned off; when static electricity with positive voltages is inputted from the signal line to the electrostatic protection device, the first thin-film transistor, the second thin-film transistor and the third thin-film transistor are turned on, and the sixth thin-film transistor is turned off.

18. The display device according to claim 16, wherein the static electricity with negative voltages and the static electricity with positive voltages are thousand volts.

* * * * *